(12) United States Patent
Hay et al.

(10) Patent No.: US 9,948,213 B2
(45) Date of Patent: Apr. 17, 2018

(54) MAGNETOSTRICTIVE POWER SUPPLY FOR BOTTOM HOLE ASSEMBLY WITH ROTATION-RESISTANT HOUSING

(75) Inventors: Richard Thomas Hay, Spring, TX (US); James H. Dudley, Spring, TX (US); Robello Samuel, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 464 days.

(21) Appl. No.: 14/001,533

(22) PCT Filed: Mar. 6, 2012

(86) PCT No.: PCT/US2012/027898
§ 371 (c)(1),
(2), (4) Date: Aug. 26, 2013

(87) PCT Pub. No.: WO2012/122178
PCT Pub. Date: Sep. 13, 2012

(65) Prior Publication Data
US 2013/0328442 A1 Dec. 12, 2013

Related U.S. Application Data

(60) Provisional application No. 61/451,264, filed on Mar. 10, 2011.

(51) Int. Cl.
| | | |
|---|---|---|
| H01L 41/12 | (2006.01) | |
| H01L 41/06 | (2006.01) | |
| H02N 2/18 | (2006.01) | |
| H02K 99/00 | (2014.01) | |
| H02K 16/02 | (2006.01) | |
| H02K 7/18 | (2006.01) | |
| E21B 41/00 | (2006.01) | |
| H02K 35/06 | (2006.01) | |

(Continued)

(52) U.S. Cl.
CPC .......... *H02N 2/18* (2013.01); *E21B 41/0085* (2013.01); *H01L 41/06* (2013.01); *H01L 41/125* (2013.01);
(Continued)

(58) Field of Classification Search
CPC ............ H02N 2/18; H02K 35/06; H02K 7/06; H02K 16/00; H02K 7/1853; H02K 57/003;
(Continued)

(56) References Cited

U.S. PATENT DOCUMENTS 3,350,583 A * 10/1967 Schiavone .............. F23Q 2/287
310/319
3,691,317 A 9/1972 Dickopp
(Continued)

FOREIGN PATENT DOCUMENTS

WO WO 2010008382 A1 * 1/2010 ......... E21B 41/0085

OTHER PUBLICATIONS

International Preliminary Report on Patentability, International Application No. PCT/US2012/027898, dated Sep. 19, 2013, 6 pages.
(Continued)

*Primary Examiner* — Joshua Benitez-Rosario
*Assistant Examiner* — Alexander Moraza
(74) *Attorney, Agent, or Firm* — John W. Wustenberg; Baker Botts L.L.P.

(57) ABSTRACT

A power supply includes a rotor having an undulated surface (658, 858, 958, 10, 58) and a magnetostrictive material disposed adjacent to the undulated surface. The undulated surface alternatingly compresses the magnetostrictive material as the rotor rotates, inducing an electric current in a conductor coupled to the magnetostrictive material.

20 Claims, 11 Drawing Sheets

(51) Int. Cl.
*H02K 7/06* (2006.01)
*H02K 16/00* (2006.01)
*G01V 1/52* (2006.01)

(52) U.S. Cl.
CPC .............. *H02K 7/06* (2013.01); *H02K 7/1853* (2013.01); *H02K 16/00* (2013.01); *H02K 35/06* (2013.01); *H02K 99/10* (2016.11); *G01V 1/52* (2013.01)

(58) Field of Classification Search
CPC .......... H02K 7/18; H02K 57/00; H02K 41/02; H02K 16/02; H01L 41/12; H01L 41/125; H01L 41/113; H01L 41/00; H01L 41/06; E21B 41/0085; E21B 4/04; G01V 1/52
USPC ..... 310/26, 339, 114; 290/52, 1 R; 367/168; 340/855.8
See application file for complete search history.

(56) References Cited

U.S. PATENT DOCUMENTS

| | | | | |
|---|---|---|---|---|
| 4,291,773 | A | | 9/1981 | Evans |
| 4,498,032 | A | * | 2/1985 | Pinson ................... H02K 7/065 310/24 |
| 4,509,001 | A | * | 4/1985 | Wakabayashi ....... G05B 19/231 318/135 |
| 4,596,171 | A | * | 6/1986 | Gerber ................... B26D 7/086 408/22 |
| 5,341,056 | A | * | 8/1994 | Maccabee ............... H01L 41/12 310/26 |
| 6,230,799 | B1 | * | 5/2001 | Slaughter ................ E21B 28/00 166/177.2 |
| 7,208,845 | B2 | * | 4/2007 | Masters ............. E21B 41/0085 290/1 R |
| 2001/0040379 | A1 | * | 11/2001 | Schultz ................... E21B 28/00 290/1 R |
| 2002/0121844 | A1 | * | 9/2002 | Ghandi .................... H02N 2/18 310/339 |
| 2003/0056990 | A1 | * | 3/2003 | Oglesby .................. E21B 4/003 175/57 |
| 2004/0129099 | A1 | * | 7/2004 | Petri ....................... F16H 25/20 74/86 |
| 2005/0269907 | A1 | * | 12/2005 | Erickson ................. H02N 2/18 310/339 |
| 2006/0037743 | A1 | * | 2/2006 | Head ..................... E21B 43/128 166/66.4 |
| 2007/0103034 | A1 | * | 5/2007 | Phillips .................. B01J 19/008 310/328 |
| 2007/0229232 | A1 | | 10/2007 | Hall et al. |
| 2008/0099245 | A1 | | 5/2008 | Hall et al. |
| 2008/0111431 | A1 | | 5/2008 | Dorel |
| 2008/0210773 | A1 | * | 9/2008 | Malek .................... F02M 45/10 239/102.2 |
| 2008/0304967 | A1 | * | 12/2008 | Mori ..................... B64C 27/615 416/134 A |
| 2010/0127582 | A1 | * | 5/2010 | Nair ..................... F03D 11/0008 310/26 |
| 2010/0133937 | A1 | † | 6/2010 | Nair |
| 2010/0212891 | A1 | * | 8/2010 | Stewart ................... E21B 23/00 166/250.12 |
| 2012/0228875 | A1 | | 9/2012 | Hardin, Jr. et al. |

OTHER PUBLICATIONS

International Search Report and Written Opinion, International Application No. PCT/US2012/027898, 12 pgs., dated Mar. 1, 2013.

\* cited by examiner
† cited by third party

MAGNETOSTRICTIVE POWER SUPPLY FOR BOTTOM HOLE ASSEMBLY WITH ROTATION-RESISTANT HOUSING

CROSS-REFERENCE TO RELATED APPLICATIONS

This application is a U.S. National Stage Application of International Application No. PCT/US2012/027898 filed Mar. 6, 2012 which claims the benefit of U.S. Provisional Application No. 61/451,264, which was filed Mar. 10, 2011, and which are hereby incorporated by reference in their entirety.

BACKGROUND

The present disclosure relates generally wellbore operations and, more particularly, to magnetostrictive power supplies for bottom hole assemblies with rotation-resistant housings.

Power for use in a downhole environment generally has been either stored in a device, such as a battery, and conveyed downhole, or it has been transmitted via conductors, such as a wireline, from another remote location. More common as of late is the use of vane turbines in the mud flow which use magnets and stator windings to generator power.

As is well known, batteries have the capability of storing only a finite amount of power and have environmental limits, such as temperature, on their use. Additionally, batteries are not readily recharged downhole. And vane turbines are subject to wear and lock up in the event of unfavorable debris in the flow.

Electrical conductors, such as those in a conventional steering tools where a cable is run on the outside of the drill pipe and enters the bottom hole assembly through a side wall port to power the down hole equipment, provide a practically unlimited amount of power, but require special facilities at the surface for deployment and typically have depth limitations and the drill string can not be rotated etc. while the conductors are in the flowpath.

In wellbore operations, a wide variety of mechanical devices are used that convert electrical power to mechanical energy in order to perform work downhole. Those mechanical devices may be subject to a variety of forces, and much of the mechanical energy may be directed to the performance of that work, while some of the energy may be released in secondary ways. What is needed is a method of harvesting mechanical energy downhole and generating electrical power therefrom.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features.

Figure 1:
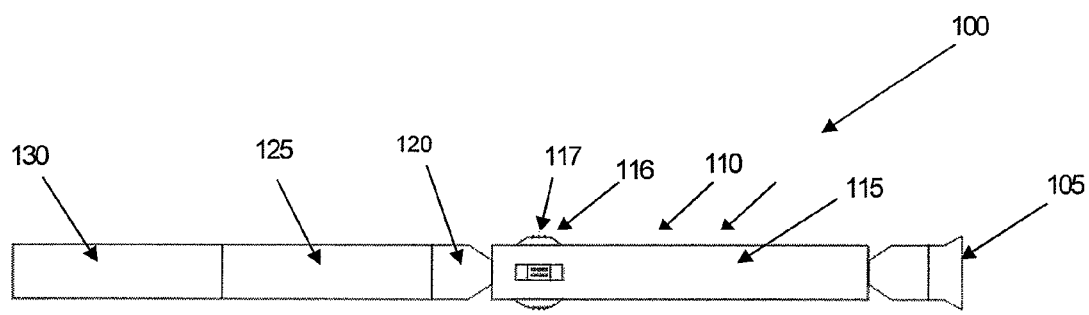
FIGS. 1-4 are diagrams of exemplary rotary steerable bottom hole assemblies, in accordance with certain embodiments of the present disclosure.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

The present disclosure relates generally wellbore operations and, more particularly, to magnetostrictive power supplies for bottom hole assemblies with rotation-resistant housings.

Illustrative embodiments of the present invention are described in detail herein. In the interest of clarity, not all features of an actual implementation may be described in this specification. It will of course be appreciated that in the development of any such actual embodiment, numerous implementation specific decisions must be made to achieve the specific implementation goals, which will vary from one implementation to another. Moreover, it will be appreciated that such a development effort might be complex and time consuming, but would nevertheless be a routine undertaking for those of ordinary skill in the art having the benefit of the present disclosure.

To facilitate a better understanding of the present invention, the following examples of certain embodiments are given. In no way should the following examples be read to limit, or define, the scope of the invention. Embodiments of the present disclosure may be applicable to horizontal, vertical, deviated, or otherwise nonlinear wellbores in any type of subterranean formation. Embodiments may be applicable to injection wells as well as production wells, including hydrocarbon wells. Devices and methods in accordance with certain embodiments may be used in one or more of wireline, measurement-while-drilling (MWD), logging-while-drilling (LWD) and completions operations.

In certain embodiments according to the present disclosure, magnetostrictive technology may be capable of generating electrical power during the process of drilling a borehole by using the mechanical energy generated in a bottom hole assembly. Magnetostrictive materials have the ability to convert kinetic/elastic energy into magnetic energy that may be used to generate electrical power. Magnetostrictive materials have the property that, when strain is induced in the material, the change in linear dimensions produces a corresponding change in magnetic field about the material. In other words, mechanical loads can deform the material and thereby rotate magnetic domains. The change of the magnetic flux can be used to generate electrical power. A suitable material for the magnetostrictive material may be Terfenol-D, available from Etrema Products, Inc. Various materials, e.g., iron and iron alloys such as Terfenol, may provide suitable magnetostrictive and giant magnetostrictive responses. These materials normally respond to a force applied to their mechanical connection by creating a magnetic field which can be detected, for example, by a surrounding coil.

Certain embodiments of systems and methods disclosed herein may be useful in rotary steerable tools which have non-rotating housings or rotation-resistant housings (such as those used for sensor platforms, communication nodes, repeater nodes, or telemetry nodes, etc.) in a work string or drill string. Certain embodiments of systems and methods disclosed herein may be used to supply electrical power to components downhole, such as actuators, sensors, electronics and steering systems, using a power supply located in a non-rotating or rotation-resistant housing. A power supply comprising a magnetostrictive rod cam rotor and winding modules may be positioned within a non-rotating or rotation-resistant housing. The magnetostrictive rod cam may be rotatably coupled to the drive shaft that runs through the housing. The drive shaft may be rotatably coupled to a surface or down hole rotating motor. Suitable surface rotating motors may include a top drive or rotary table. Suitable downhole rotating motors may include a mud motor or turbine motor. The rotating motor may provide rotational energy to the shaft that is converted into electrical energy by the magnetostrictive power supply.

For simplicity, various elements may be generally referenced herein as a stator due to remaining stationary relative to a rotor. And, various elements may be generally referenced herein as the rotor due to corresponding movement. However, it should be understood that motion is relative and, thus, the convention of which is the rotor or stator may be interchangeable.

Figure 2:
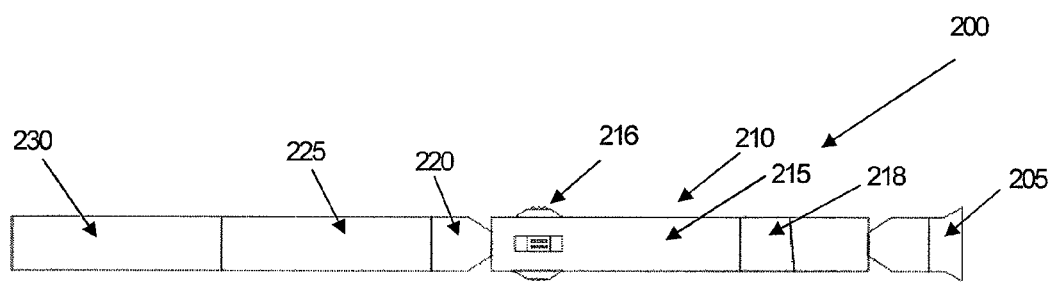
Figure 3:
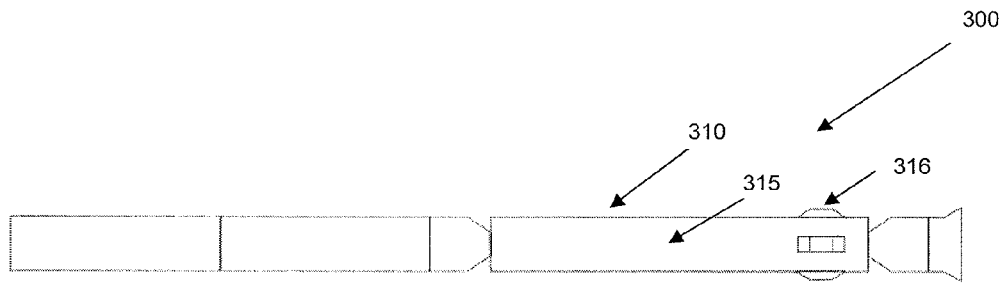

FIGS. 1, 2, and 3 show various exemplary rotary steerable borehole assemblies, in accordance with certain embodiments of the present disclosure. FIG. 1 shows a general layout of an exemplary bottom hole assembly 100 with a drill bit 105, a rotary steerable tool 110 utilizing a rotation-resistant housing 115, a drive sub 120, a measuring-while-drilling (MWD) and/or logging-while-drilling (LWD) section 125, and a telemetry sub 130 to communicate with the surface. The rotation-resistant housing 115 may be prevented from freely rotating by one or more spring-loaded carriages 116. One or more wheels 117 resting in a spring-loaded carriage 116 may be pressed against a borehole wall (not shown) to brace the housing 115 against the borehole wall.

A series of inside shafts (not shown) may run the length of the borehole assembly 100. At the top of the rotation-resistant housing 115, the shaft inside the housing may be connected to the shaft inside the drive sub 120. At the bottom of the rotation-resistant housing 115, the shaft inside the housing may be connected to the shaft inside drill bit 105. Mud may flow inside one or more shafts. Mud may also flow between a shaft and a housing at various points along the length of the inside shaft if so desired.

FIG. 2 shows a general layout of a rotary steerable borehole assembly 200 with a drill bit 205, a rotary steerable tool 210 utilizing a rotation-resistant housing 215, an adjustable joint 218, a drive sub 220, a MWD and/or LWD section 225, and a telemetry sub 230 to communicate with the surface. The rotation-resistant housing 210 may be prevented from freely rotating by one or more adjustable pads 216. Adjustable pads 216 may be arranged around the outer surface of the rotation-resistant housing 215.

In certain embodiments, the adjustable pads 216 may extend outward and away from the housing to engage the wall of the wellbore. In certain embodiments, the adjustable pads 216 include a piston that extends outward to engage the wall of the wellbore. In certain embodiments, the adjustable pads 216 may include ribs that pivot or rotate to engage the wall of the wellbore. In other exemplary embodiments, the rotation-resistant housing may be prevented from rotating by a knuckle joint with one or more deflecting ramps.

A series of inside shafts (not shown) may run the length of the bottom hole assembly 200. At the top of the rotation-resistant housing 215, the shaft inside the housing may be connected to the shaft inside the drive sub 220. One or more shafts inside the housing 215 may be connected to the shaft inside drill bit 105 via the adjustable joint 218. As described previously, mud may flow inside one or more shafts and/or between a shaft and a housing.

Figure 4:
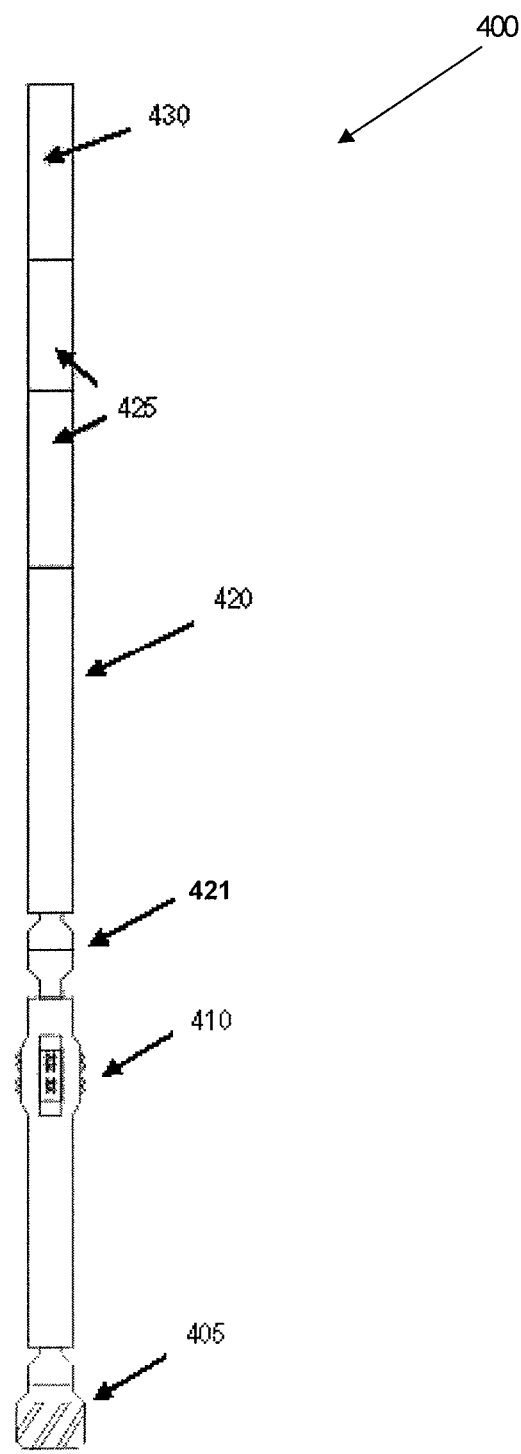

FIG. 3 shows a layout of a bottom hole assembly 300 similar to the bottom hole assemblies 100 and 200, but with carriages/pads 316 at the lower end of a rotary steerable tool 310 utilizing a rotation-resistant housing 315. FIG. 4 shows a layout of a rotary steerable bottom hole assembly 400 that may include a drill bit 405, a rotary steerable tool 410, a shaft coupling 421, a drive sub 420, MWD/LWD sensors 425, and a telemetry module 430 to communicate with the surface. In the bottom hole assembly 400, rotational drive may be provided via a motor in the drive sub 420 above the rotary steerable section 410. In certain example embodiments, the rotary steerable is driven by one or more of a mud motor (e.g., a positive displacement motor), a turbine or vane motor, and an electric motor; and rotational energy may be provided, for example, by the surface drilling rig with the top drive or rotary table. By way of example without limitation, a hydraulic motor may be used to drive the shaft running through the rotation-resistant housing. When fluid flows through the mud motor or turbine, the rotor inside, which may be connected to the output shaft of the mud motor, may rotate. Accordingly, any suitable hydraulic or electric motor positioned above the shaft in the drill string may provide rotational energy to the magnetostrictive power supply mounted in the housing.

It should be understood that the examples of FIGS. 1-4 are not limiting. Embodiments of the present disclosure may have other rotary steerable tool configurations. And each of various configurations may include a magnetostrictive electrical power supply, in accordance with certain embodiments of the present disclosure. In certain embodiments, power may be supplied to a steering control system with a magnetostrictive power supply.

A magnetostrictive electrical power supply may be disposed in a housing at any suitable location. The magnetostrictive power supply may be placed inside the rotation-resistant housing between the inside shaft and the outside of the housing. The power supply may be placed in a portion of the housing that is not easily prone to bending as a result of the bowing, flexing or pivoting of the shaft at the lower end of the assembly. Such bowing, flexing, or pivoting at the lower end of the shaft at the lower end of the assembly allows for the steering direction of the assembly to change in a desired direction.

Figure 5A:
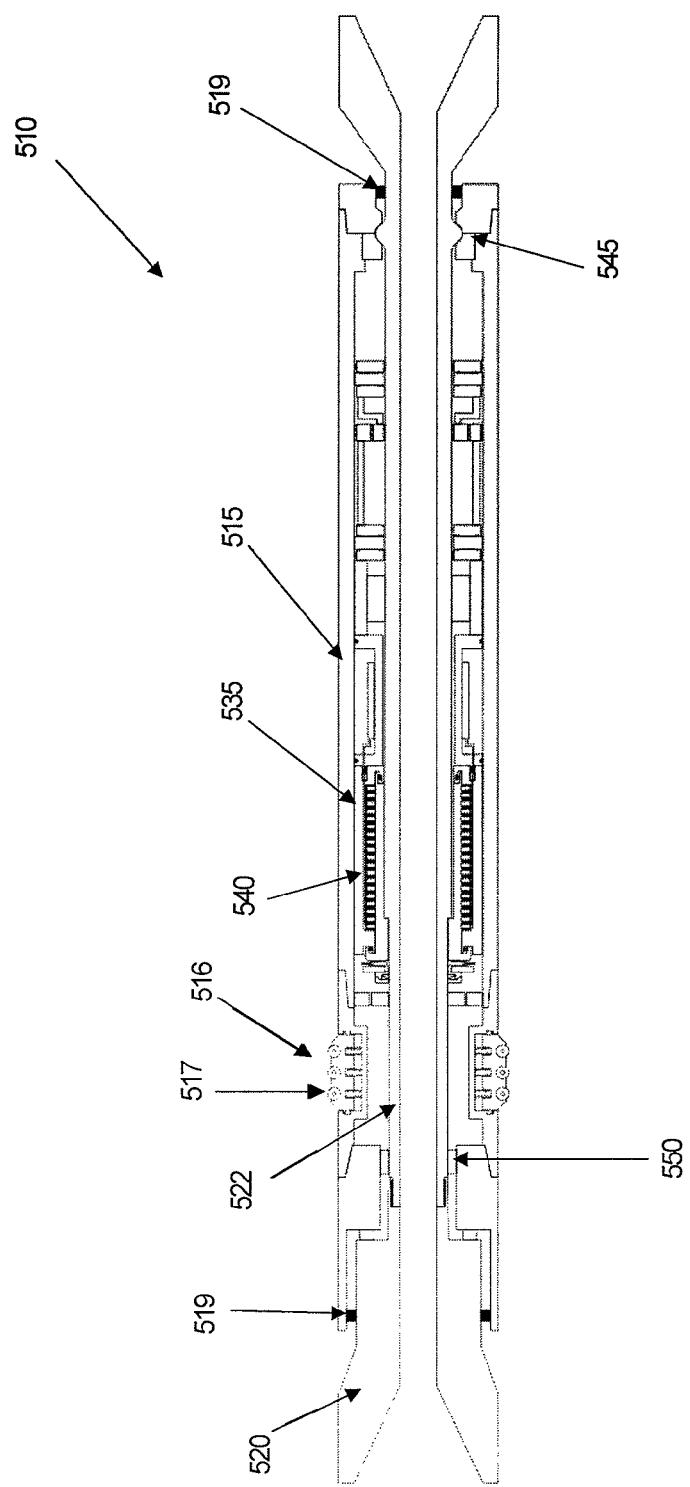
FIG. 5A is a longitudinal cross-sectional view of an example rotary steerable tool with a magnetostrictive power supply, in accordance with certain embodiments of the present disclosure.

FIG. 5A shows a longitudinal cross-sectional view of an example rotary steerable tool 510 with a magnetostrictive power supply 535, in accordance with certain embodiments of the present disclosure. The magnetostrictive power supply 535 may implement a magnetostrictive rod array 540 to provide a housing power supply. A drive sub 520 may be threaded to an internal shaft 522 that may run the rest of the length of the tool. The outer housing 515 may be sealed on each end, e.g., with seals 519, and may be configured such that drilling mud or other fluid may be kept away from the moving surfaces, e.g., in the actuator area. And the housing 515 may be filled with a lubricant. In other embodiments, the outer housing 515 may not sealed and drilling mud or other fluid may be allowed to flow or be stationary in the actuator area.

A thrust bearing 545 may transfer axial loads from the housing 515 to the drive shaft 522. A radial bearing 550 may support the shaft 522 and drive sub 520. In this embodiment, the anti-rotation device 516 may include a spring-loaded cartridge with wheels 517 that are configured to engage a wellbore wall to create rotational friction. The rotational friction may reduce the tendency of the housing 515 to rotate with the shaft 522. The anti-rotation housing 515 may thread into the steering housing. Other example embodiments may employ one or more other anti-rotational devices.

An inductive communications link or slip ring (not shown) may be positioned between the shaft 522, which is rotatably connected with the drill string and bottom hole assembly, and the housing 515 to relay communications. Instructions may be passed to the housing electronics and data can be retrieved from the housing and transmitted to the surface by the downhole telemetry system. Information may be transmitted to the surface by, for example, one or more of a telemetry system such as mud pulse, wired drill pipe, pipe in pipe electrical communication, acoustic, or EM-MWD (electromagnetic-MWD).

Figure 5B:
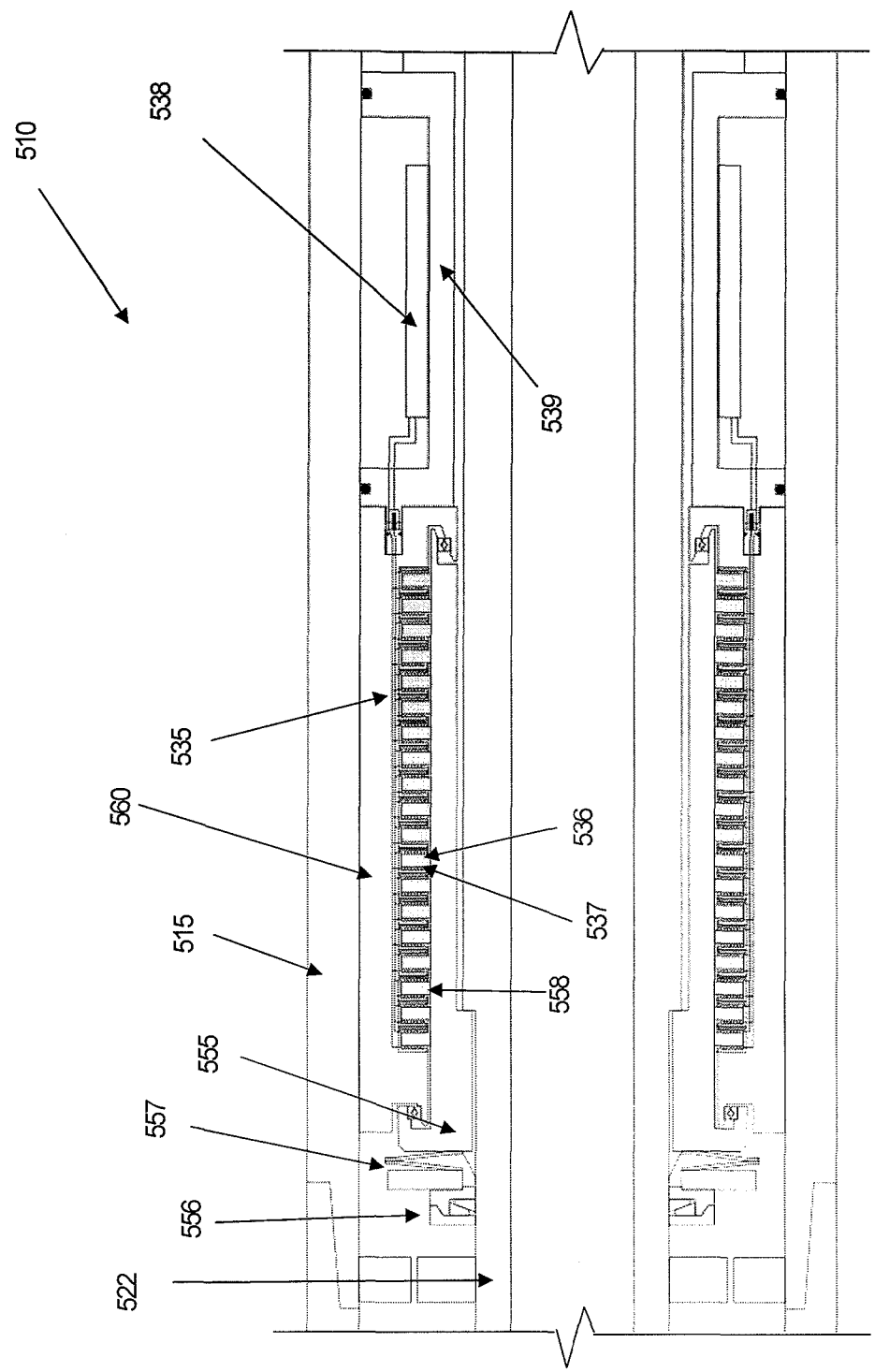
FIG. 5B is a close-up view of the example rotary steerable tool with the magnetostrictive power supply of FIG. 5A.

FIG. 5B shows a close-up view of the rotary steerable tool 510 with the magnetostrictive power supply 535, as an example of the power supply and electronics for use with an example rotary steerable sub in accordance with certain embodiments of the present disclosure. The rotor of the rotary steerable tool 510 may include a cam rotor 555 and the shaft 522. The cam rotor 555 may be fixed to the shaft 522 with a compressed wedge C-ring pair 556 to lock the cam rotor 555 in place with a spacer and spring assembly 557. The cam rotor 555 may rotate with the drive shaft 522 and may be engaged to the drive shaft 522 through the use of a spline arrangement on the shaft 522. This may allow the cam rotor 555 to stay axially positioned using two radial bearings that engage with a stator 560. The stator 560 may be fixed with the housing 515. The outer face 558 of the cam rotor 555 may engage magnetostrictive rods 536 of the stator 560. The face 558 may be undulated with at least one cyclical eccentricity to create variable compression on the magnetostrictive rods 536 as the shaft 522 rotates. As the shaft 552 rotates, the magnetostrictive rods 536 may be alternately compressed and allowed to decompress as the cam passes by the magnetostrictive rods 536. This compression and decompression, in turn, induces a time-varying magnetic field in and around the magnetostrictive rods 536. As depicted, the outer face 558 of the cam rotor 555 may have an undulated symmetric pattern. In certain alternative embodiments, the pattern may be skewed so that the rising and falling slopes of an undulation are not symmetrical.

In certain embodiments, certain magnetostrictive materials may be soft and/or brittle such that the materials wear, fracture and/or deform due to contact with the cam. Accordingly, certain embodiments of automotive engine lifters (not shown) may be necessary. In certain embodiments, each magnetostrictive rod 536 may be coupled to a hardened contact and/or include friction reducing-coatings. Certain embodiments including hardened contacts and/or friction reducing-coatings may change the material properties of a given rod so that the heat-affected zone is no longer magnetostrictive. The contact area of a given rod may be plated and/or capped with any suitable hard and/or friction-reducing material. Certain embodiments may include roller lifters where a roller bearing rides on the cam.

In certain embodiments, the magnetostrictive rods 536 may be spring-loaded and/or hydraulically or pneumatically cushioned to provide compliance for pressure and/or temperature changes and/or to dampen the impulse stress from impact. Thus, a hydraulic/pneumatic element and/or a spring action may account for differential material expansion rates and may dampen the impact load when the lifter and/or magnetostrictive material impacts the cam. In certain embodiments with shorter rods, there may be no room for a separate spring or lifter, and hard face and/or anti-friction coatings may be suitable. In certain embodiments with longer rods, lateral supports for the rods may be provided.

Wire may be wound around one or more of the magnetostrictive rods. In certain example embodiments, there is a winding 537 around each rod 536. In other example embodiments, windings may group two or more rods. For example, one or more rods 536 that experience the same compression load timing with the rotation of the shaft may be grouped for a winding. In certain embodiments, the shape of the rod 536 can be made in longitudinal plates that align with the same compression cycle from the cam.

In certain example embodiments, each end of the coil winding 537 may be wired together with windings that correspond to magnetostrictive rods 536 that experience the same phase of the cam. In certain example implementations, the wires that are wound around the magnetostrictive rods 536 may be coupled to power conditioning electronics 538, which may be located in an electronics housing 539. In certain example implementations, the electronics housing 539 may further include one or more of tool control electronics, sensors, memory including one or more of executable instructions and data, and one or more processors. The power generated by the power supply 535 may be used to supply electrical energy to other devices throughout the tool such as actuators for steering, survey sensors such as magnetometers, accelerometers and gyroscopes, formation evaluation sensors such as resistivity, gamma ray, density, porosity, acoustic fluid shear and drilling environment sensors such as weight on bit, bending, shaft torque, mud viscosity and density, temperature, vibration, whirl and shaft RPM and actuators such as fluid sampling equipment, steering pads and electric motors and electric clutches used in steering bias mechanisms, etc.

In certain example implementations, a radial bearing may be positioned below the electronics housing 539 to straighten the shaft 522 over the interval of the cam rotor 555. This radial bearing may also serve to cause the rotation of the shaft 522 more concentric over the power generator interval. In other example implementations, the radial bearing below the electronics housing 539 is omitted.

In certain example implementations, below the radial bearing (if present) is a biasing unit. Certain biasing units may include a pair of nested eccentric rings. The nested eccentric rings may be rotated by the rotating shaft 522 through, for example, a clutch or brake mechanism, and further through a step down speed transmission, such as a harmonic drive gear box. In certain example implementations, each eccentric ring may be paired with a clutch and a harmonic drive gear box. Below the bias unit may be a spherical bearing that allows the shaft 522 to pivot about the bearing. In certain example implementations, a flexible seal may be positioned below the biasing unit to keep the oil contained in the housing while the bit box tilts.

Figure 6B:
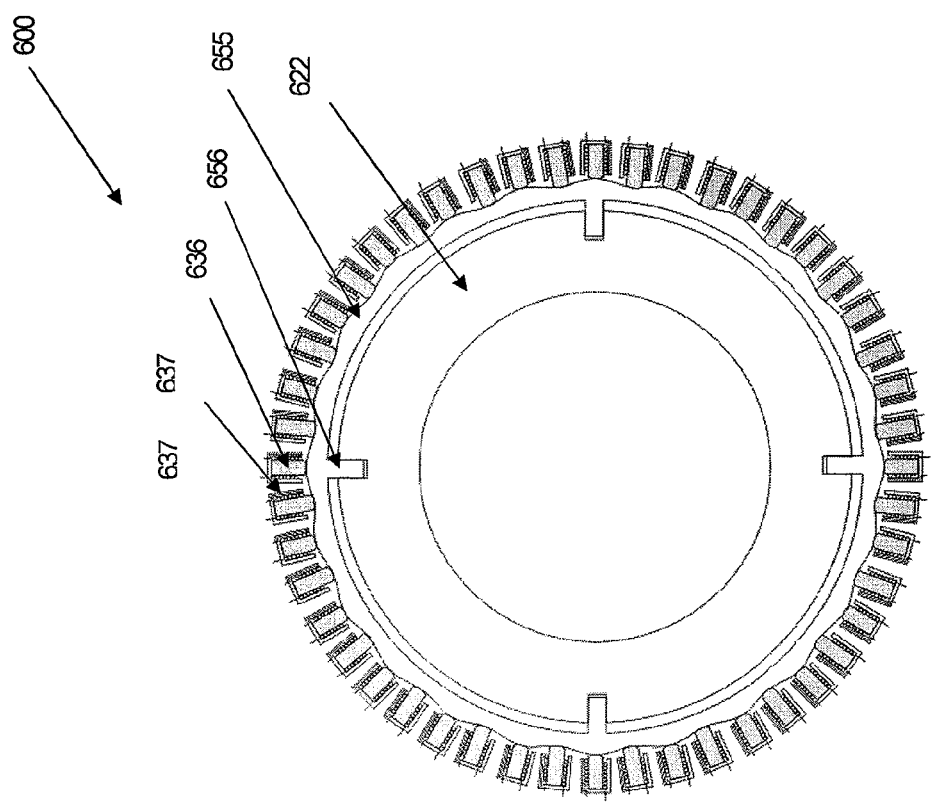
FIGS. 6A, 6B and 6C are latitudinal cross-sectional views illustrating an exemplary assembly 600, in accordance with certain embodiments of the present disclosure.
Figure 6A:
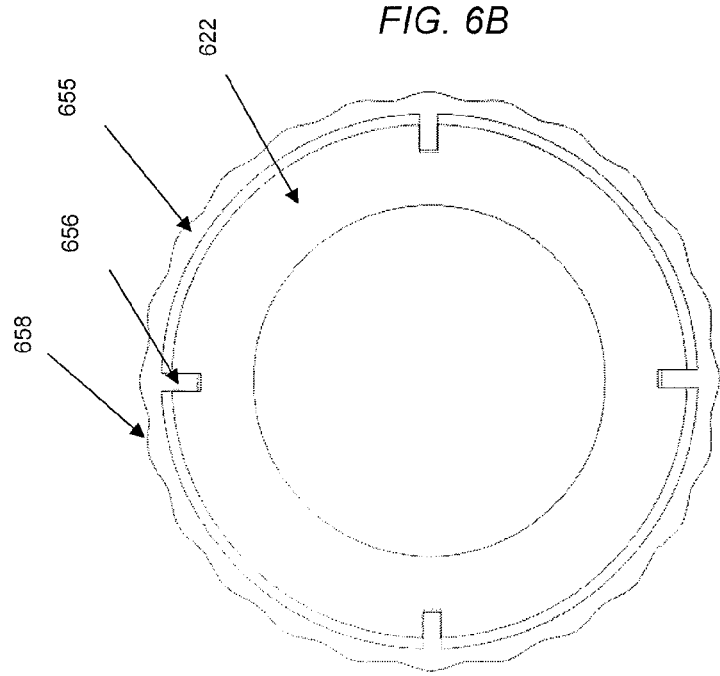
Figure 6C:
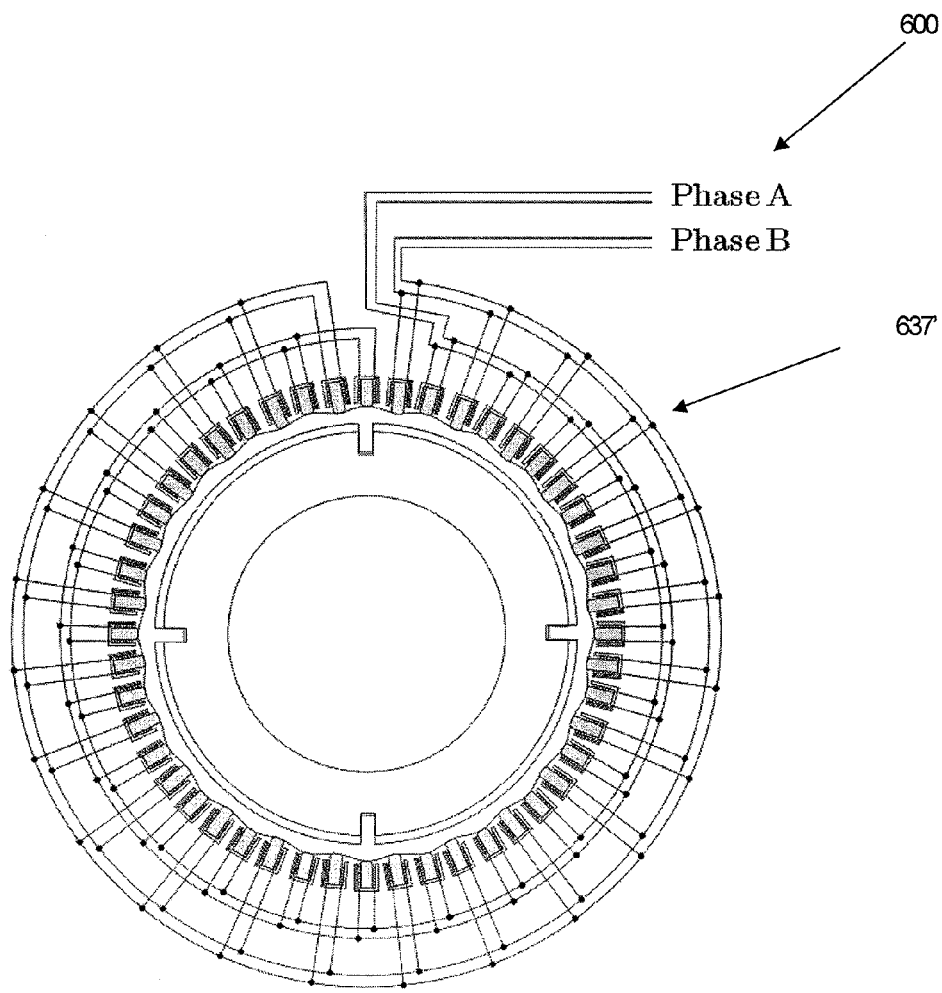

FIGS. 6A, 6B and 6C are latitudinal cross-sectional views illustrating an exemplary assembly 600, in accordance with certain embodiments of the present disclosure. While only one assembly 600 is depicted, it should be understood that certain embodiments may have a plurality of assemblies 600. In certain embodiments, the plurality of assemblies 600 may be positioned axially in parallel. In certain embodiments, the plurality of assemblies 600 may be coupled electrically either in parallel or in series.

A rotor of the assembly 600 may include a cam rotor 655 splined to a shaft 622. The example depicted may be a two-phase stator and 28-pole rotor, for example. In the example illustration, the cam undulations on the outer surface 658 of the cam rotor 655 have been exaggerated to exemplify the variation in diameter of the cam rotor 655. In certain example implementations, the variance in the rotor diameter may depend on the Young's modulus of the magnetostrictive rod to ascertain how much compression the rod can bear without breaking. By way of example without limitation, actual magnetostrictive rod compression may vary from 0.0001" to 0.030" or more depending on the configuration, rod length relative to the compression/expansion axis and material selection. In the example of FIG. 6A, the spines 656 may be designed to allow the cam rotor 655 to float over the drive shaft 622 while rotational energy is transferred via the spines 656.

In certain example implementations, separating the cam rotor 655 from the shaft 622 may allow for control of the diameter variations while rotating the shaft 622. The shaft 622 may be exposed to forces, such as bending and twisting, which could cause the shaft 622 to flex off of the centerline of the housing. In such situations, separate rotor and shaft configurations may avoid or mitigate the possibility of the magnetostrictive rods being subjected to uneven compression cycles, which may even damage the rods. Other example implementations of rotor-shaft coupling are possible, including, for example, machining the rotor cam undulations on the shaft material itself to integrate the rotor into the shaft body directly.

FIG. 6B shows an example of magnetostrictive rods 636 of the stator positioned around the cam rotor 655. The cam rotor 655 may rotate while the magnetostrictive rods 636 remain fixed with the housing of the stator. As a result, the magnetostrictive rods 636 may experience cyclical compression as the shaft 622 rotates. As depicted, a winding 637 may be around each rod 636.

In certain example implementations, the wire wound around the magnetostrictive material may be a magnetic wire. One example magnetic wire may be coated with, for example, a polyimide coating. Other example magnetic wires may feature coatings which are thinner, such as Gore's high strength toughened fluorocarbon (HSTF). A thinner insulator may allow more terfenol material and thus more power output.

While the rods 636 are depicted as rectangular rods or groups of square or rectangular rods surrounded by one winding, it should be understood that the magnetostrictive material may have any other suitable form (e.g., trapezoidal rods to better fill the space around the rotor with magnetic field generating material). In the example shown in FIG. 6B, the phase of the cam and the rods may be designed so that each rod is approximately 180 degrees out of phase with the rod beside it. In other example implementations, the compression phase difference between rods may vary.

FIG. 6C shows an exemplary two-phase coil wiring arrangement 637', in accordance with certain embodiments of the present disclosure. In one example implementation, there may be two phases and two sets of winding pairs. The rods that are in phase 0° or Phase A may be wired together in parallel, and the extended rods may be likewise in phase 180° or Phase B may be wired in parallel together as depicted. In this manner, the electric power generated by each phase may work in unison to provide compression or expansion for each phase. In certain example implementations, the output of each phase may be a sinusoidal waveform at a frequency that corresponds to the rotational speed of the of the shaft times the number of lobes on the cam, which in this example is 28 lobes. If the drive shaft were rotating at 120 RPM, then the electrical output frequency of the coils may be (120 RPM/60 s/min)*28=56 Hz.

In certain example implementations, the system may be designed to maximize the speed of compression and relaxation of the magnetostrictive rods to, in turn, increase the power extracted from the windings. In certain implementations, a limiting factor may be the propagation speed of the compression wave through the magnetostrictive rod. Another limitation may be the electrical inductance of the system, which resists changes to the magnetic field. In some instances, it may be desirable to increase the cyclical frequency of compression and relaxation of the magnetostrictive rods to extract more energy. In these cases, various means may be used to increase the rotation speed of the rotor and optimize the rod and winding size. By, for example, shortening the length of the rod, the propagation time of the compressive and relaxing stress wave through the magnetostrictive rod may decrease, and the magnetostrictive rod may tolerate a higher frequency and still stay relatively in phase with the rotation speed of the cam.

In certain example implementations, one or more in-phase wirings may be wired in series to, for example, increase the voltage and reduce the current delivered from the windings. While such an arrangement may increase the series resistance of the group of windings, it may generate a higher voltage which may be converted to direct current by using, for example, through a full wave bridge rectifier. Alternatively, a step-up or step-down transformer can be used just before the rectifiers to adjust the voltage being applied to the rectifiers.

Figure 7:
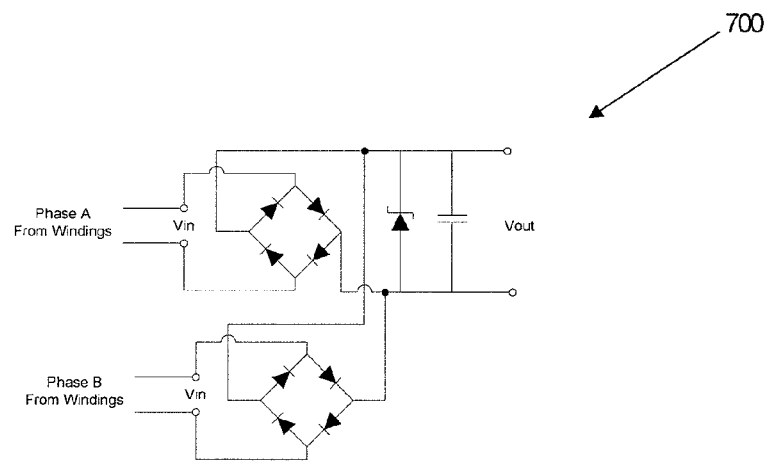
FIG. 7 shows an example of a full wave rectifier fed by two sets of windings, in accordance with certain embodiments of the present disclosure.

FIG. 7 shows an example of a full wave rectifier 700 fed by two sets of windings. In general, the rectifier may convert alternating current (AC) from the windings to direct current. In certain example implementations, after the energy is converted to direct current, a smoothing capacitor is used to reduce the ripple of the output voltage. In certain example implementations, a zener diode may be included to limit the output voltage to, for example, prevent voltage surges from propagating past the power supply to other electronics in the housing. In example implementations, the output of the rectifier may be fed to circuits to use or the current may be subjected to further conditioning through the use of voltage regulators, DC-to-DC converters. In some example implementations, the output may power one or more electrical circuits, actuators, or sensors.

In certain example implementations, the rotational energy may be supplied by the rotational motion of the drive shaft. This may limit the speed of the cam to the speed of the shaft. In other example implementations, the speed of the rotor relative to the shaft may be increased through the use of gears. Some example systems feature a harmonic drive gear. The harmonic drive gear may be mounted to the shaft and may output a high multiple of rotation for example 1:180. This may boost the 120 RPM example to a generator frequency of 10080 Hz. In other example implementations, the undulations of the cam may be increased, and the size of each magnetostrictive rod and winding module may be reduced to increase the frequency of the generated signal. In another example, the rotor can be connected to a vane that creates rotation from flowing mud through the tool.

Figure 8A:
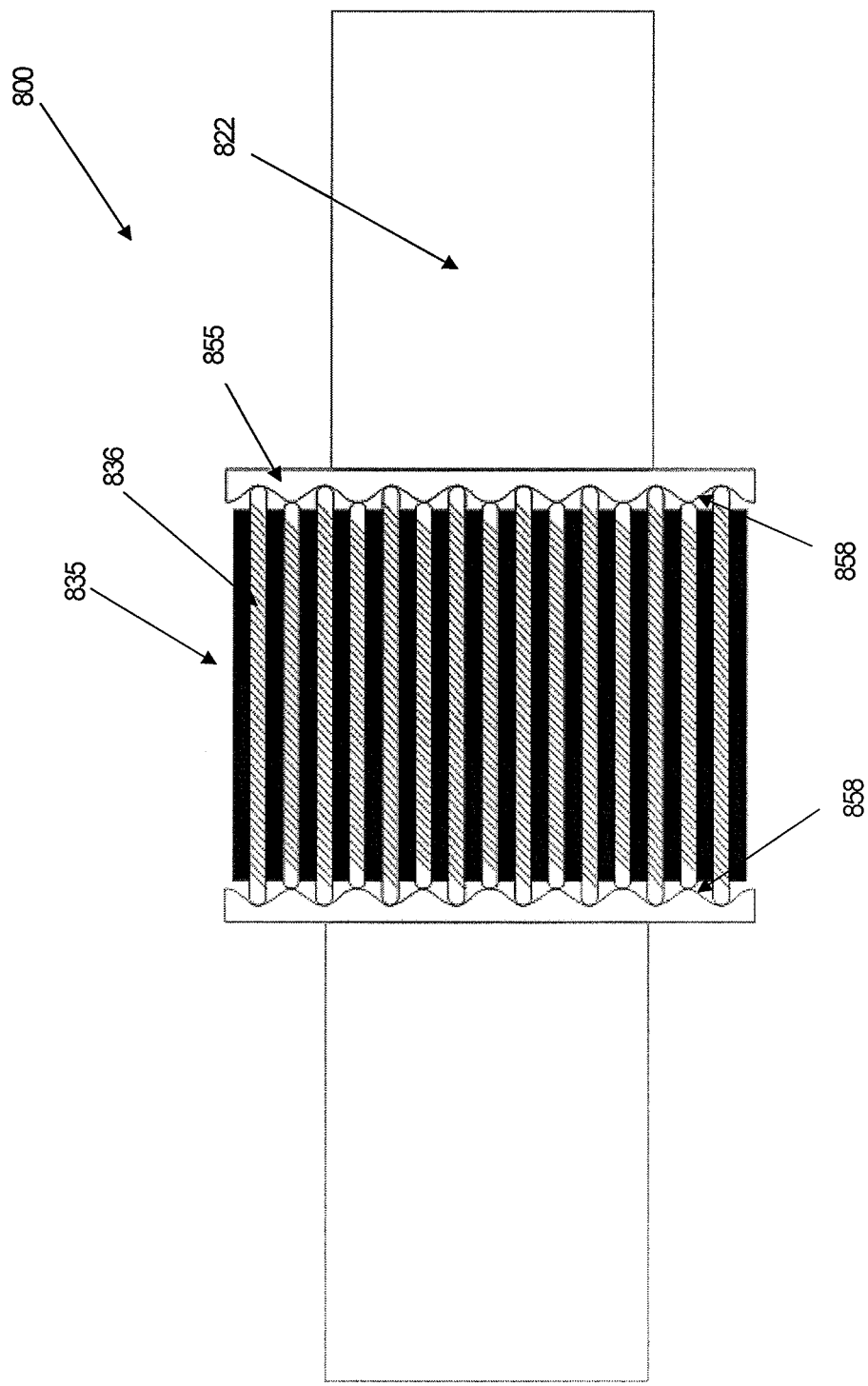
FIGS. 8A and 8B show an axial magnetostrictive rod compression assembly, in accordance with certain embodiments of the present disclosure.
Figure 8B:
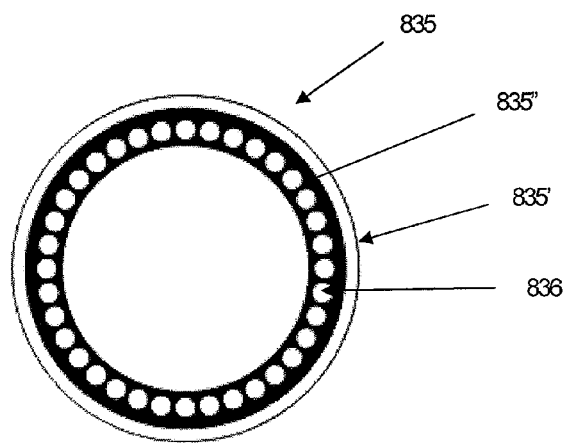

It should be understood that the exemplary rotor-stator configurations disclosed herein are not limiting. FIGS. 8A and 8B show an axial magnetostrictive rod compression assembly 800, in accordance with certain embodiments of the present disclosure. In the view of FIG. 8, the housing of the stator is not shown. The magnetostrictive rods 836 may be disposed lengthwise along an axis of the tool instead of being disposed radially. The magnetostrictive rods 836 may be supported in a support carriage 835" of the stator that may be coupled to the tool housing (not shown) and does not rotate with a shaft 822. A cam assembly 855 may be rotatably coupled to the shaft 822 and may be disposed in an axial orientation to compress and relax the magnetostrictive rods 836, similar to the compression and relaxation discussed above. Thus, the rotor may include the cam assembly 855 that compresses both ends of the magnetostrictive rods 836.

As depicted, in certain embodiments, the cam assembly 855 may have two ends with faces 858 undulating in synchronization. Again, the undulations as depicted should not be seen as limiting. In certain embodiments, the undulation may be less pronounced than that which is depicted. In certain alternative embodiments, the faces 858 of the cam assembly 855 may rotate in opposite directions, or one face 858 may rotate while the other face 858 remains stationary.

FIG. 8B is a cross-section of the stator 835 of the assembly 800. The stator 835 may include housing 835' at may be coupled to the tool housing (not shown). In certain embodiments, the magnetostrictive rods 836 may be supported by the support carriage 835" at least in part with a flexible potting compound, which may include elastomeric material, such as rubber to hold the rods 836 in position while the cam assembly 855 rotates. In certain embodiments, the wiring of the stator may be essentially identical to previous examples, since for exemplary purposes the stator is a two-phase generator. However, the number of phases should not be seen as limiting, as embodiments according to the present disclosure may be implemented with any suitable number of phases.

Figure 9:
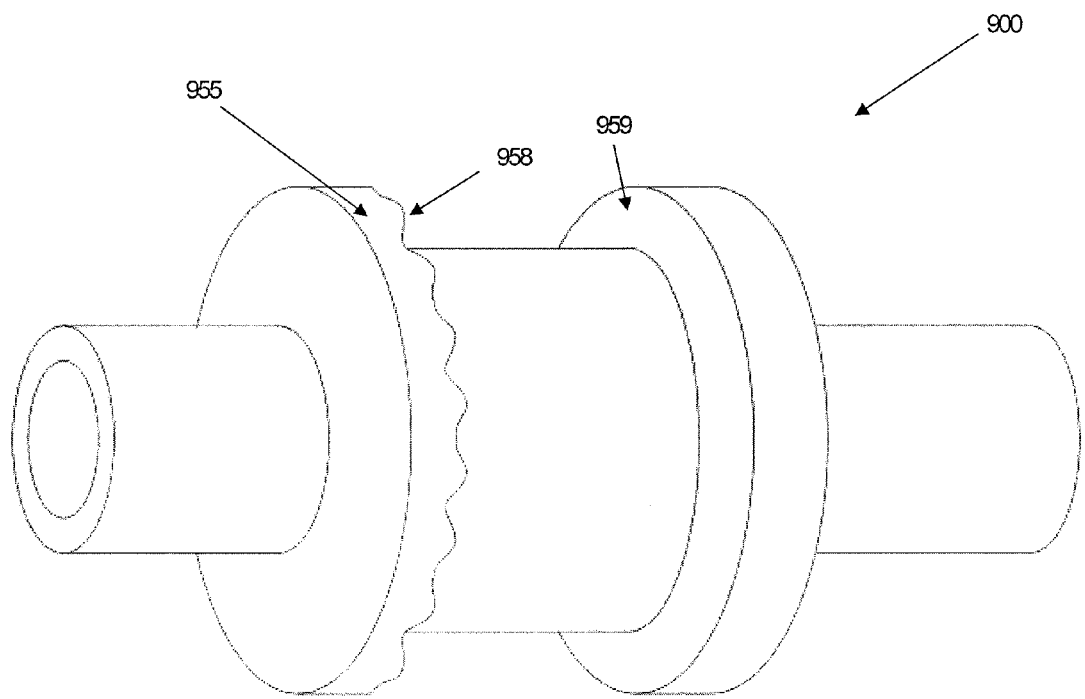
FIG. 9 shows an axial magnetostrictive rod compression assembly, in accordance with certain embodiments of the present disclosure.

In certain alternative embodiments, a flat-faced member may be disposed generally opposite an undulating cam to vary the compressive load on the magnetostrictive rods. FIG. 9 shows another axial magnetostrictive rod compression assembly 900, in accordance with certain embodiments of the present disclosure. In assembly 900, only one end of each magnetostrictive rod may receive compressive forces from the cam rotor 955. Opposite the undulated face 958 of the cam rotor 955 may be a flat-faced member 959. The assembly 900 may provide an advantage of propagation speed of stress waves requiring less time needed to completely compress the rods or let them expand. Again, a harmonic drive transmission may be employed to boost the speed of the cam rotor 955.

Figure 10A:
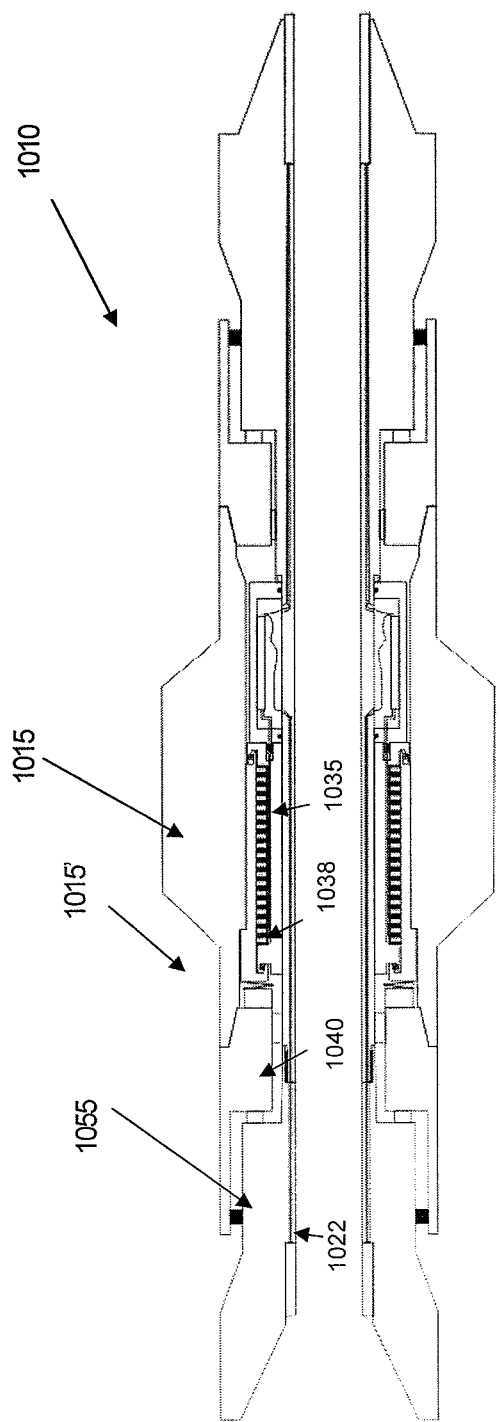
FIGS. 10A and 10B are cross-sectional views of an example tool with a magnetostrictive power rotor rotatably coupled to a shaft, in accordance with certain embodiments of the present disclosure.
Figure 10B:
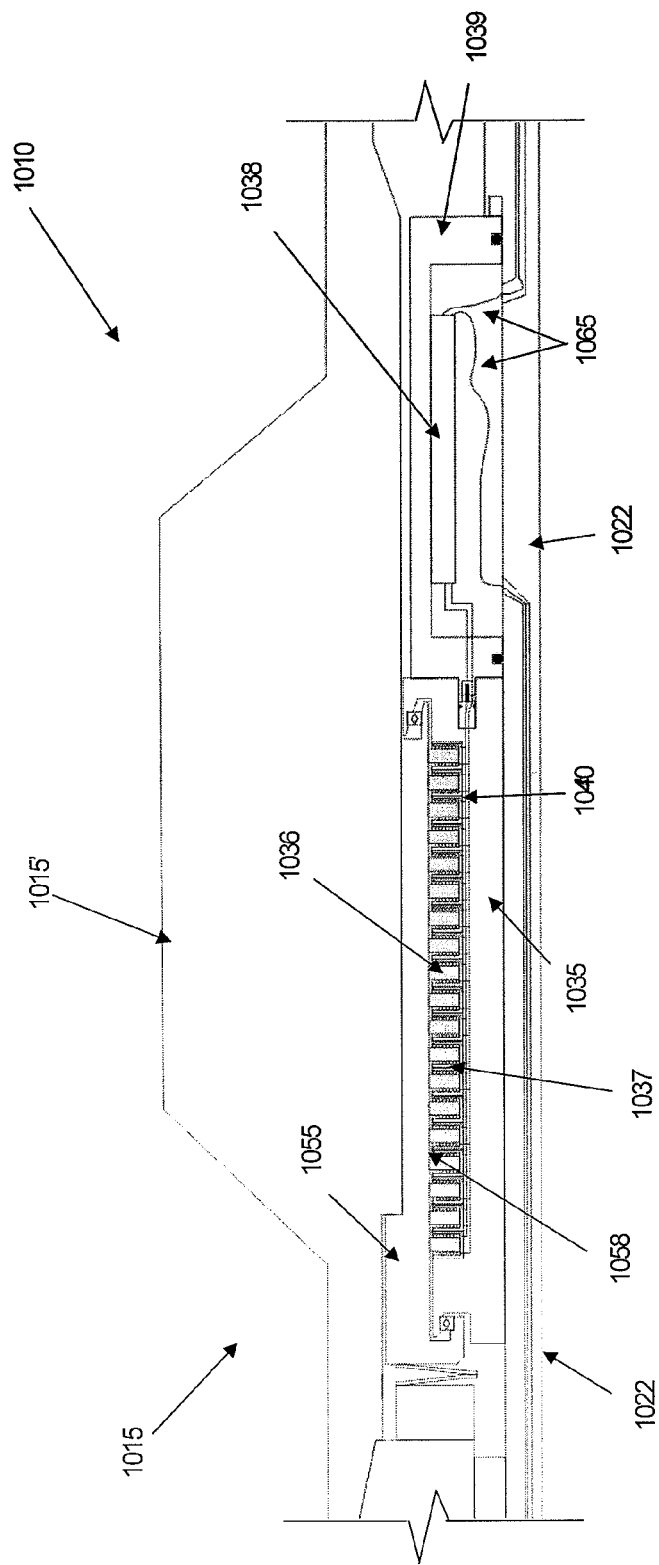

Referring again to radial magnetostrictive rod compression systems, FIGS. 10A and 10B are cross-sectional views of an example tool 1010 with a magnetostrictive power rotor 1035 rotatably coupled to a shaft 1022, in accordance with certain embodiments of the present disclosure. FIG. 10B is a close-up view of a portion of FIG. 10A. The tool 1010 may include a rotation-resistant housing 1015 having a stabilizer 1015'. The rotation-resistant housing 1015 may have a stator 1055 with undulated face 1058 coupled to the body of the stabilizer 1015'. By way of non-limiting example, the stator 1055 may be splined and locked to the body of the stabilizer 1015'. The magnetostrictive power rotor 1035, with a magnetostrictive rod array 1040, windings 1037, and electronics 1038, may be mounted on the shaft 1022 to rotate with the shaft 1022. This configuration may be implemented with other tool elements disclosed herein. In this particular configuration, power may be distributed to other tool elements that may be connected to a box or pin of the drill string. Hence, power may be transferred via wires, connectors, and/or any suitable conductors 1065 along the shaft 1022 to the connectors on each end of the tool 1010. The tool 1010 may include seals to keep the area filled with oil and bearings, such as ball or roller bearings to provide mechanical loading support through the tool 1010. Additionally, the configuration may be implemented to operate in mud so that seals would not be necessary. The stator 1055 may be supported such that it is splined and floats on the housing 1015.

In reference to the more detailed view of FIG. 10B, when the stabilizer blades 1015' contact the wellbore wall, the blades 1015' and outer housing 1015 may stop rotating relative to the bore, while the shaft 1022 with the magnetostrictive rods 1036 rotates, thereby causing cyclical compression of the magnetostrictive rods 1036. The electronics 1038 may be keyed to the shaft 1022, and the magnetostrictive rod carrier of the rotor 1035 may be keyed and electrically connected to the electronics carrier 1039 so it all rotates with the shaft 1022.

The stabilizer 1015' may be of any suitable form, and the upper and lower ends of stabilizer 1015' may be connected to the drill string. In the above example, integral straight blades 1015' are shown. However, the stabilizer blades may be of any suitable form, including integral blades (such as a spiral integral stabilizer), welded (straight or spiraled), or stabilizers threaded onto the housing, for example. The stabilizer may be modified to permit the installation of various components inside of it. The stabilizer blades may have gaps or flow paths between the blades to allow for drilling fluid and cuttings to pass by the blades.

The tool 1010 may be positioned in the bottom hole assembly to power down hole devices such as MWD/LWD and steering assemblies. It also may be placed throughout the drill string to power communications repeaters, sensors and actuators like fluid sampling and sensing devices in a distributed manner. Such repeaters may be wired pipe repeaters, such as in a wired drill pipe system, electromagnetic telemetry repeaters, acoustic repeaters, mud pulse repeaters or other forms of telemetry repeaters. A slip ring or transformer may be used to jump electrical energy and/or communications signal between the motor housing and the shaft if electrical power is desired on the other side of the motor stator/rotor pair.

Figure 11:
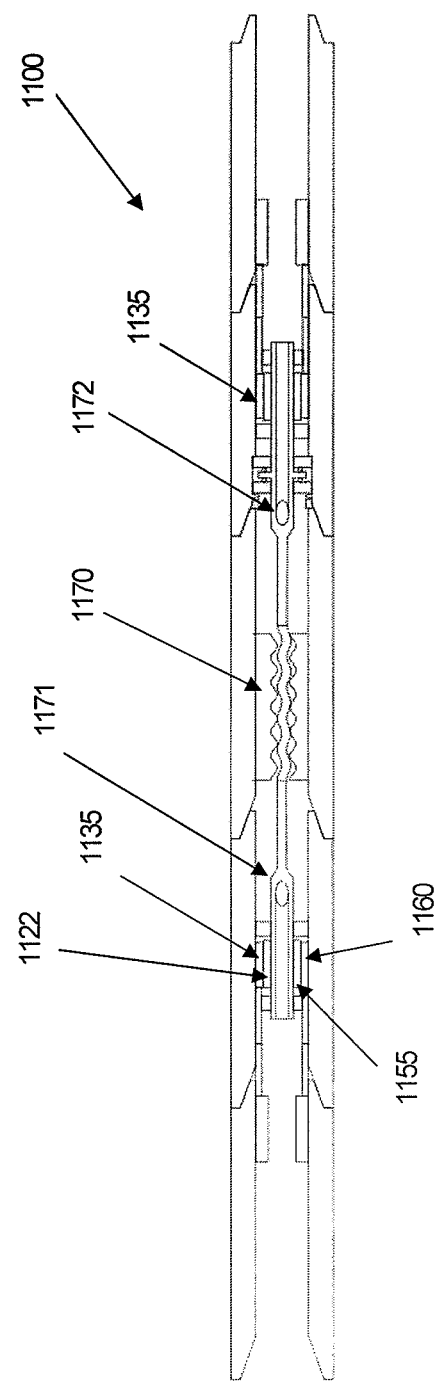
FIG. 11 is a cross-sectional view of an example assembly using a positive displacement motor to generate power, in accordance with certain embodiments of the present disclosure.

Additionally, a hydraulic or electric motor may be integral to a power supply rather than being separate entities. FIG. 11 illustrates an assembly 1100 using a positive displacement motor 1170 to generate power, in accordance with certain embodiments of the present disclosure. A magnetostrictive power supply 1135 according to embodiments disclosed herein may be positioned above, below or interstitially between stages of the positive displacement motor 1170. Depending on needs for routing power, the magnetostrictive rods may be mounted on the drive shaft 1122 so power can be extracted to elements rotatably connected to the drive shaft 1122. Or, the rods may be mounted in an inverted arrangement on the motor housing to provide power to elements connected to the motor housing, such as the MWD above the motor, for example.

A MWD/LWD or telemetry sub may be fitted with actuators and electronics that require power. The electronics carrier may connect through a connector across the tool joint to the power supply electronics in the upper power sub. The drive shaft 1122 may be supported with radial bearings and may have a through path for mud to flow down its center. Mounted onto the drive upper drive shaft 1122 may be a cam rotor 1155 which engages a stator that is connected to the power housing. The stator 1160 may be rotationally fixed with the collar which is the power housing 1115. Below the power generator may be another radial bearing. The two radial bearings may be used to allow for concentric rotation of the rotor shaft in the generator area.

The rotor cam 1155 may be splined or fixed to the rotor shaft 1122, or integrated into its parent material. The mud may exit the drive shaft 1122 and flow around the shaft 1122 via a flow diverter 1171 and enters the positive displacement motor 1170. The positive displacement motor 1170 may create rotational energy from mud flow and hydraulic force. In certain embodiments, another flex shaft 1172 may be connected below the hydraulic motor in a reverse manner to supply power to devices below the power section. In addition, a thrust bearing may be included in this lower assembly to support the rotor rotation, but this bearing could easily be positioned in the upper section as well. It should be understood that the lower drive shaft 1172 can be extended downward to a bit box and optionally through a bent housing to provide drilling rotational power to a drill bit. The positive displacement motor 1170 may also be any suitable type of hydraulic motor supply of rotational energy including a vane or turbine motor.

Accordingly, certain embodiments of the present disclosure allow for a magnetostrictive power supply for a bottom hole assembly. Although certain non-limiting examples are disclosed herein, it should be understood that embodiments according to the present disclosure may be implemented with any suitable rotary steerable tool that utilizes a rotation-resistant housing. Further, in addition to rotary steerable applications, a magnetostrictive power supply in accordance with the present disclosure may be used in a straight shaft in a rotation-resistant housing used for mounting various FEWD (Formation Evaluation While Drilling) or other sensors or actuators.

And even though the figures depict embodiments of the present disclosure in a vertical orientation, it should be understood by those skilled in the art that embodiments of the present disclosure are well suited for use in a variety of orientations. Accordingly, it should be understood by those skilled in the art that the use of directional terms such as above, below, upper, lower, upward, downward and the like are used in relation to the illustrative embodiments as they are depicted in the figures, the upward direction being toward the top of the corresponding figure and the downward direction being toward the bottom of the corresponding figure.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. Also, the terms in the claims have their plain, ordinary meaning unless otherwise explicitly and clearly defined by the patentee. The indefinite articles "a" or "an," as used in the claims, are defined herein to mean one or more than one of the element that the particular article introduces; and subsequent use of the definite article "the" is not intended to negate that meaning.

What is claimed is:

1. A power supply comprising:
   a rotor disposed axially on a shaft comprising an undulated surface;
   a magnetostrictive material disposed adjacent to the undulated surface, wherein the magnetostrictive material engages the undulated surface of the rotor;
   a plurality of windings around the magnetostrictive material, wherein at least a plurality of the plurality of windings that experiences the same phase of the rotor are wired together; and
   a cylindrical flat-faced member disposed axially on the shaft, wherein a flat-faced surface of the cylindrical flat-faced member is opposite the undulated surface, wherein the magnetostrictive material is disposed between the flat-faced surface and the undulated surface such that the flat-faced surface and the undulated surface vary a cylindrical compressive load on the magnetostrictive material, and wherein the undulated surface alternatingly compresses the magnetostrictive material as the rotor rotates, inducing an electric current in a conductor coupled to the magnetostrictive material.

2. The power supply of claim 1, further comprising:
   a magnetostrictive array comprising the magnetostrictive material in a plurality of members disposed adjacent to the undulated surface.

3. The power supply of claim 1, wherein the rotor comprises:
   a shaft rotatably coupled with a cam rotor, wherein the cam rotor comprises the undulated surface.

4. The power supply of claim 1, further comprising:
   a magnetostrictive array comprising the magnetostrictive material in a plurality of members disposed adjacent to the undulated surface; and
   wherein the rotor comprises a shaft, and the plurality of members is oriented along an axis of the shaft.

5. The power supply of claim 4, wherein the rotor comprises the undulated surface and a flat outer face.

6. The power supply of claim 1, further comprising:
   a magnetostrictive array comprising the magnetostrictive material in a plurality of members disposed adjacent to the undulated surface; and
   wherein the rotor comprises a shaft, and the plurality of members is oriented radially with respect to an axis of the shaft.

7. The power supply of claim 1, wherein the undulated surface comprises a symmetrical pattern.

8. The power supply of claim 2, further comprising:
a conductor arrangement comprising the conductor and a winding around each of the plurality of members.

9. The power supply of claim 2, further comprising:
a conductor arrangement comprising the conductor and a winding around a group of two or more of the plurality of members.

10. The power supply of claim 2, wherein adjacent members of the plurality of members are approximately 180 degrees out of phase with respect to the undulated surface.

11. The power supply of claim 10, further comprising:
a two-phase conductor arrangement comprising the conductor and coupled to the plurality of members.

12. The power supply of claim 1, further comprising:
a conductor arrangement comprising the conductor and coupled to the plurality of members, wherein the undulated surface comprises a number of lobes, and wherein the power supply outputs a waveform at a frequency corresponding to a rotational speed of the times the number of lobes.

13. The power supply of claim 2, wherein the cam rotor is splined to and floats on the shaft.

14. A bottom-hole assembly comprising:
a rotation-resistant housing;
a rotor disposed axially on a shaft and coupled with a stator disposed within the rotation-resistant housing, wherein the rotor comprises an undulated surface;
an array of members disposed adjacent to the undulated surface, each member comprising magnetostrictive material;
a plurality of windings around the magnetostrictive material, wherein at least a plurality of the plurality of windings that experiences the same phase of the rotor are wired together; and
a cylindrical flat-faced member disposed axially on the shaft, wherein a flat-faced surface of the cylindrical flat-faced member is opposite the undulated surface, wherein the magnetostrictive material is disposed between the flat-faced surface and the undulated surface such that the flat-faced surface and the undulated surface vary a cylindrical compressive load on the magnetostrictive material, and wherein the undulated surface alternatingly compresses the array of members as the rotor rotates, inducing an electric current in a conductor coupled to the array of members.

15. The bottom hole assembly of claim 14, wherein:
the rotor comprises a shaft extending through a rotation-resistant housing; and
the plurality of members is oriented along an axis of the shaft.

16. The bottom hole assembly of claim 15, wherein:
the rotor comprises the undulated surface and a flat outer surface.

17. The bottom hole assembly of claim 14, wherein:
the rotor comprises a shaft extending through a rotation-resistant housing; and
the array of members is oriented radially with respect to an axis of the shaft.

18. The bottom hole assembly of claim 14, wherein:
the stator comprises the undulated surface; and
the array of members is rotatably coupled with the rotor.

19. The bottom hole assembly of claim 14, wherein the rotor is coupled to a positive displacement motor.

20. A method of supplying power, the method comprising:
providing a rotor disposed axially on a shaft and coupled with a stator, wherein the rotor comprises an undulated surface;
providing a magnetostrictive material disposed adjacent to the undulated surface, wherein the magnetostrictive material engages the undulated surface of the rotor;
providing a plurality of windings around the magnetostrictive material, wherein at least a plurality of the plurality of windings that experiences the same phase of the rotor are wired together; and
providing a cylindrical flat-faced member disposed axially on the shaft, wherein a flat-faced surface of the cylindrical flat-faced member is opposite the undulated surface, wherein the magnetostrictive material is disposed between the flat-faced surface and the undulated surface such that the flat-faced surface and the undulated surface vary a cylindrical compressive load on the magnetostrictive material, and wherein the undulated surface alternatingly compresses the magnetostrictive material as the rotor rotates, inducing an electric current in a conductor coupled to the magnetostrictive material.

* * * * *